(12) United States Patent
Mehta et al.

(10) Patent No.: US 11,551,395 B2
(45) Date of Patent: Jan. 10, 2023

(54) METHOD AND SYSTEM FOR GENERATING THREE DIMENSIONAL ANIMATION IN GAMING ENGINE

(71) Applicant: Infosys Limited, Bangalore (IN)

(72) Inventors: Swapnil Madan Mehta, Pune (IN); Ansa Davis, Irinjalakuda (IN); Mayuresh Mhaiskar, Pune (IN); Srinivas Choudary Devalla, Mysuru (IN)

(73) Assignee: INFOSYS LIMITED, Bangalore (IN)

( * ) Notice: Subject to any disclaimer, the term of this patent is extended or adjusted under 35 U.S.C. 154(b) by 0 days.

(21) Appl. No.: 17/358,416

(22) Filed: Jun. 25, 2021

(65) Prior Publication Data

US 2022/0005250 A1 Jan. 6, 2022

(30) Foreign Application Priority Data

Jul. 6, 2020 (IN) .............................. 202041028697

(51) Int. Cl.
*G06T 13/40* (2011.01)
*G06F 30/00* (2020.01)
*G06T 17/10* (2006.01)

(52) U.S. Cl.
CPC .............. *G06T 13/40* (2013.01); *G06F 30/00* (2020.01); *G06T 17/10* (2013.01)

(58) Field of Classification Search
None
See application file for complete search history.

(56) References Cited

U.S. PATENT DOCUMENTS

2022/0080318 A1* 3/2022 Li ........................... A63F 13/52

FOREIGN PATENT DOCUMENTS

| CN | 109658484 A | 4/2019 |
| CN | 106846442 B | 7/2019 |

OTHER PUBLICATIONS

Wang et al. "A CAD-linked virtual assembly environment;" Feb. 2006, International Journal of Production Research, vol. 44, No. 3. pp. 467-486. (Year: 2006).*

(Continued)

*Primary Examiner* — Peter Hoang
(74) *Attorney, Agent, or Firm* — Troutman Pepper Hamilton Sanders LLP (Rochester)

(57) ABSTRACT

The present technique discloses a method and system generating three dimensional animation in gaming engine. A CAD tool is used to generate 3D animation of kinematic assembly and it also stores the information related to complex joints and constraints of each component of the kinematic assembly. Then, it extracts information related to the co-ordinates of each component of the kinematic assembly in unit time and generate transformation matrix for each of those components. This transformation information is stored in JSON file. The gaming engine receives this JSON file from the CAD tool and convert the transformation matrix into gaming engine understandable pattern based on the co-ordinate system supported by the gaming engine. The gaming engine stores this converted transformation matrix into Quaternion representation. Then, the gaming engine applies tangential continuity to the Quaternion representation of each of the components of kinematic assembly to generate the 3D animation in gaming engine.

15 Claims, 6 Drawing Sheets

(56) References Cited

OTHER PUBLICATIONS

Weisbrod Imaging; "MakeHuman to Blender 2.8 to Unity Part 2: Importing Character & Animations into Unity," Apr. 11, 2020; YouTube video; pp. 1-13; https://www.youtube.com/watch?v=4YRKhZL3CLg (Year: 2020).*

Chidre'sTechTutorials; "Euler Angles Quaternions Gimbal Lock| Explained—Unity Scripting API Transform Tutorial 05;" Jun. 5, 2019; YouTube video; p. 1; https://www.youtube.com/watch?v=Qn9Xdh972Z8 (Year: 2019).*

Kev Binge; "Blender Graph Editor: Can Animation Curves Improve Your 3D Life?" Sep. 20, 2018; YouTube video; p. 1-3; https://www.youtube.com/watch?v=OpApF-K6kow (Year: 2018).*

Unity; "Animation Curves and Events—Unity Official Tutorials;" Feb. 2, 2014; YouTube video; pp. 1-2; https://www.youtube.com/watch?v=8VG2aK2AGSk (Year: 2014).*

Martin, E., Unity Partners with PIXYZ Software to Unlock CAD Data for Real-Time Development, https://blog.unity.com/technology/unity-partners-with-pixyz, Mar. 6, 2018.

"Importing a CAD model into a Unity 3D Based Application on Runtime", https://github.com/i2e-haw-hamburg/cad-in-unity, Jan. 11, 2016.

"FBX Converter, Conversion and Simplification of CADA data to FBX", https://www.coretechnologie.com/products/3d-evolution/fbx-converter.html, last accessed May 27, 2021.

* cited by examiner

METHOD AND SYSTEM FOR GENERATING THREE DIMENSIONAL ANIMATION IN GAMING ENGINE

This application claims the benefit of Indian Patent Application Serial No. 202041028697 filed Jul. 6, 2020, which is hereby incorporated by reference in its entirety.

FIELD

This invention relates generally to generating three dimensional (3D) animations in gaming engine, and in particular, to a method and system for generating three dimensional animation of a kinematic assembly designed by a Computer Aided Design (CAD) tool in a gaming engine, wherein the kinematic assembly comprises a plurality of components.

BACKGROUND

For creating any immersive experience for any engineering scenario, having an animation explaining the working process of any mechanism or a product is very important. In gaming engine, animations are important to portray object movements and behaviors. Animations are important to give life to the game characters and objects. However, gaming tools does not have any provision to work with mechanism and constraints and hence it is difficult to generate three dimensional animations in gaming engines.

SUMMARY

The present invention overcomes the above mentioned drawbacks by using CAD tools to generate the 3D animations in gaming engine.

According to the present embodiment, a method for generating three dimensional animation of a kinematic assembly designed by a Computer Aided Design (CAD) tool in a gaming engine, wherein the kinematic assembly comprises a plurality of components is disclosed. The method includes receiving a transformation matrix from the CAD tool for each of the plurality of components of the kinematic assembly, wherein the transformation matrix comprises position and location information of each of the plurality of components of the kinematic assembly at a unit time. Then, the transformation matrix for each of the plurality of components of the kinematic assembly is converted into a gaming engine understandable pattern based on a Co-ordinate system supported by the gaming engine. Thereafter, a three dimensional representation of the plurality of components is stored in the gaming engine. Finally, the three dimensional animation of the kinematic assembly is generated in the gaming engine by applying tangential continuity to the stored three dimensional representation.

In an additional embodiment, a system for generating three dimensional animation of a kinematic assembly designed by a Computer Aided Design (CAD) tool in a gaming engine, wherein the kinematic assembly comprises a plurality of components is disclosed. The system includes a memory coupled to one or more processors which are configured to execute programmed instructions stored in the memory including, receiving a transformation matrix from the CAD tool for each of the plurality of components of the kinematic assembly, wherein the transformation matrix comprises position and location information of each of the plurality of components of the kinematic assembly at a unit time, converting the transformation matrix for each of the plurality of components of the kinematic assembly into a gaming engine understandable pattern based on a Co-ordinate system supported by the gaming engine, storing a three dimensional representation of the plurality of components in the gaming engine and generating the three dimensional animation of the kinematic assembly in the gaming engine by applying tangential continuity to the stored three dimensional representation.

In another embodiment of the present disclosure, a non-transitory computer readable storage medium for generating three dimensional animation of a kinematic assembly designed by a Computer Aided Design (CAD) tool in a gaming engine, wherein the kinematic assembly comprises a plurality of components is disclosed. The computer readable storage medium which is not a signal stores computer executable instructions for receiving a transformation matrix from the CAD tool for each of the plurality of components of the kinematic assembly, wherein the transformation matrix comprises position and location information of each of the plurality of components of the kinematic assembly at a unit time, converting the transformation matrix for each of the plurality of components of the kinematic assembly into a gaming engine understandable pattern based on a Co-ordinate system supported by the gaming engine, storing the converted transformation matrix in Quaternion representation in the gaming engine and storing the converted transformation matrix in Quaternion representation in the gaming engine.

BRIEF DESCRIPTION OF THE DRAWINGS

Various embodiments of the invention will, hereinafter, be described in conjunction with the appended drawings. There is no intention to limit the scope of the invention to such blocks or objects, or to any particular technology. These simplified diagrams are presented by way of illustration to aid in the understanding of the logical functionality of one or more aspects of the instant disclosure and is not presented by way of limitation.

DETAILED DESCRIPTION

The foregoing has broadly outlined the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

Exemplary embodiments of the present invention provide a method and system for generating three dimensional animation in gaming engine. A CAD tool is used to generate 3D animation of kinematic assembly and it also stores the information related to complex joints and constraints of each component of the kinematic assembly. Then, it extracts information related to the co-ordinates of each component of the kinematic assembly in unit time and generate transformation matrix for each of those components. This transformation information is stored in JSON file. The gaming engine receives this JSON file from the CAD tool and convert the transformation matrix into a gaming engine understandable pattern based on the co-ordinate system supported by the gaming engine. The gaming engine stores this converted transformation matrix into Quaternion representation. Then, the gaming engine applies tangential continuity to the Quaternion representation of each of the components of kinematic assembly to generate the 3D animation in gaming engine.

CAD tools stores precise geometric information and its topology as Boundary Representation(B-Rep) using NURBS. CAD tools tessellates NURBS data to render geometry, both tessellated and precise geometry formats are supported by CAD tools. Gaming engines do not support precise geometry but only tessellated data. Methods to convert precise geometry into tessellated format exists. Similarly, CAD tool stores constraints information of all the components of a kinematic assembly and generates animation curves in real time. Gaming engine lacks this ability of generating animation curves from geometry constraints. The present disclosure solves this problem. This disclosure provides a way to transfer animation curve created in CAD tools to gaming engine and hence it is eliminating the need to create the animation curve manually in gaming engine.

Figure 1:
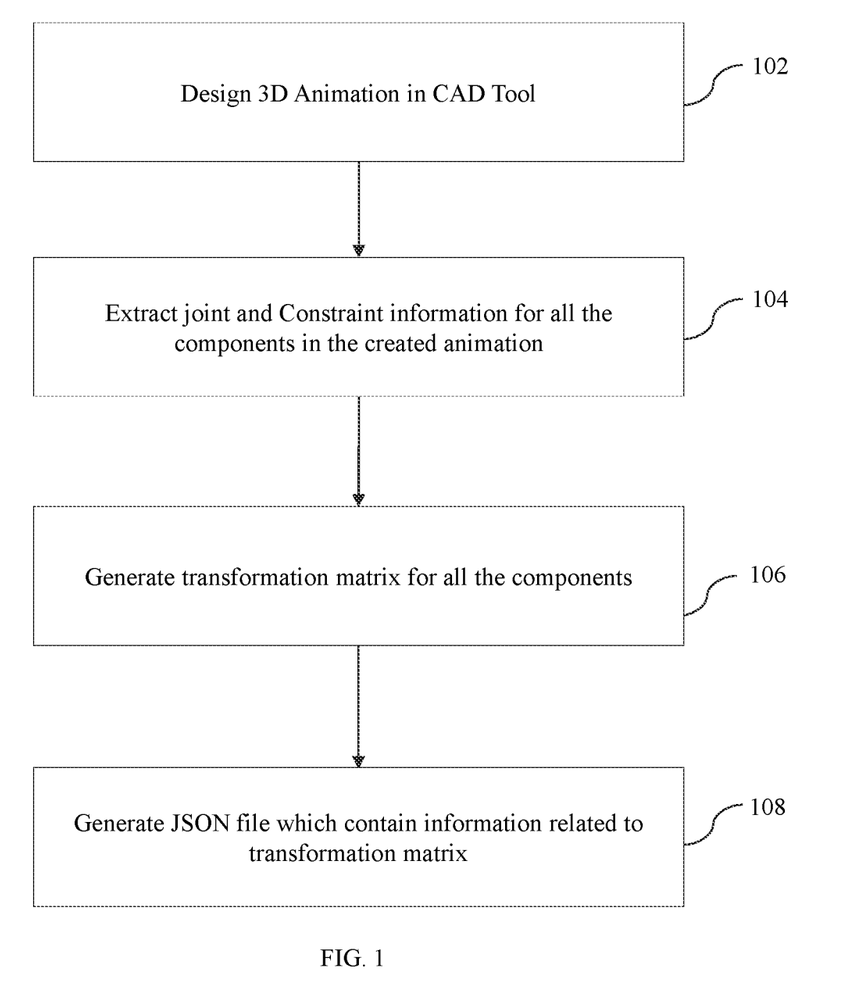
FIG. 1 is a flowchart, illustrating a method for extracting and storing information related to three dimensional animation in a CAD tool, in accordance with an embodiment of the present invention.
Figure 2:
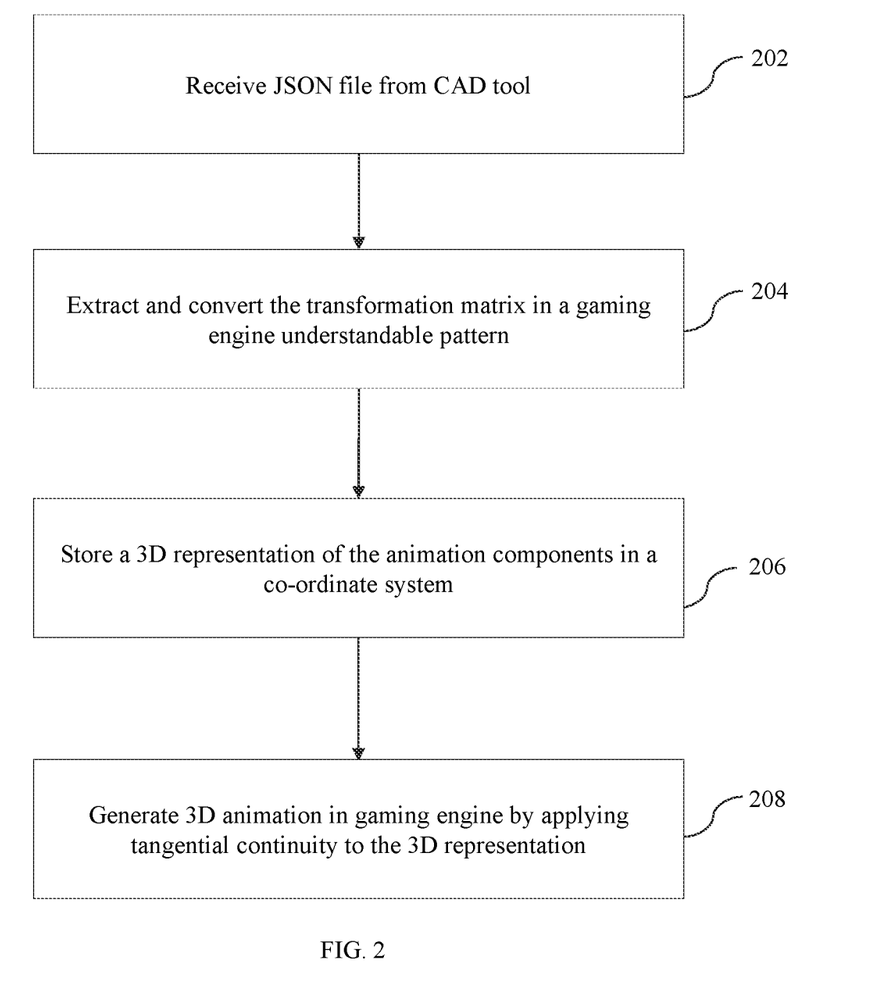
FIG. 2 is a flowchart, illustrating a method for generating three dimensional animation in gaming engine, in accordance with an embodiment of the present invention.

FIGS. 1 and 2 describe the process of generating 3D animation in gaming engine. FIG. 1 is a flowchart illustrating a method for extracting and storing information related to three dimensional animations in a CAD tool. At step 102, a 3D animation of a kinematic assembly is created by using the CAD tool. In an exemplary embodiment, we can use Computer Aided Three-dimensional Interactive Application (CATIA) to design the 3D animation. The kinematic assembly comprises a plurality of components. Each of these plurality of components has one or more joints and constraints. The operating mechanism of the plurality of components is largely depends on the relative motions of the joints. The joints allow motion of the components in some directions and constrained it in others. Hence, the degree of the freedom of the movement of the components are determined by the joints and constraints. For example, in case of fuel injection mechanism in a typical Internal Combustion (IC) engine, there are tappets governed by CAM shaft and springs, which decide on how much fuel to inject in which cylinder and when. One has to consider many critical constraints and joints to create a virtual 3D simulation of this assembly. For example, there are surface based joints like cam-surface of cams on the camshaft touching the tappets for them to open. These tappets are also governed by spring tension/contraction forces, thus resulting in a ratio/law-based joints. Also, these tappets are constraint to move in a single axis and are constraint by the surface of the cylinder head for them to hold their position, thus necessitating a constraint based joint. Based on these joints and constraints information, CAD tool generates the three dimensional animation in real time. This is an inherent property of the CAD tool. At step 104, the CAD tool extracts information related to all of these joints and constraints of the components of the kinematic assembly. This step is explained with the help of an example. This example is only for understanding purpose and does not limit the scope of the invention. In an exemplary embodiment, joints and constraints information from CATIA tool is extracted by executing CAA code. Once CAA code is executed, the CATIA session starts. After the CATIA session starts, it identifies and loads the CATProduct which has the kinematic assembly in question and reads the animation file stored in that CATProduct. It reads the animation information of one component of the kinematic assembly at a time for every step in the animation and extracts below information from the animation file—a) information related to joints and constraints of the plurality of components in the kinematic assembly; and b) information related to relative movements (e.g. position and/or rotation information) of the plurality of components in the kinematic assembly at a unit time. Referring back to FIG. 1, at step 106, a transformation matrix is generated for the plurality of components in the kinematic assembly based on the information captured by the CAD tool mentioned hereinabove in relation to step 104. The transformation matrix comprises position information of the plurality of components in the kinematic assembly at a unit time in a three dimensional co-ordinate system. Finally, at step 108, a JSON file is generated which store the transformation matrix in it.

Figure 5:
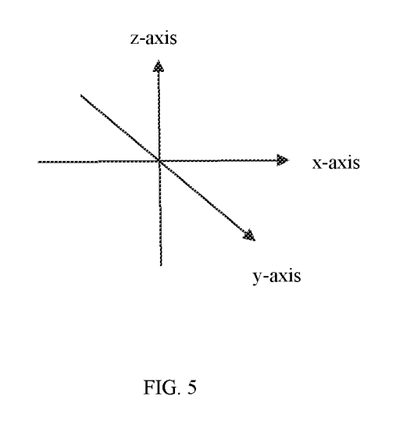
FIG. 5 is a diagram depicting co-ordinate system in CAD tool, in accordance with an embodiment of the present invention.
Figure 6:
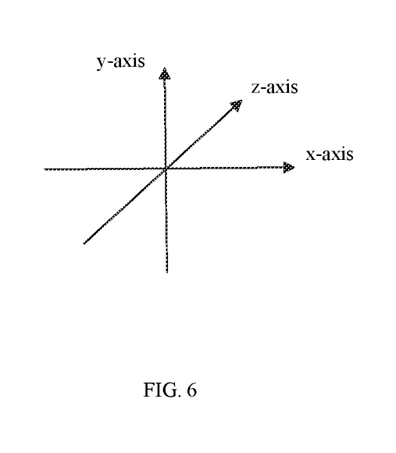
FIG. 6 is a diagram depicting co-ordinate system in gaming engine, in accordance with an embodiment of the present invention.

FIG. 2 is a flowchart, illustrating a method for generating three dimensional animations in gaming engine, in accordance with an embodiment of the present invention. The JSON file generated by the CAD tool is received by the Gaming Engine at step 202. The information stored in JSON file is read by the gaming engine. Each component of the 3D animation created in CAD tool is represented as a game object in the gaming engine. Hence, each component of the kinematic assembly is mapped with the corresponding game object in the gaming engine. The CAD tool stores geometric information in NURBS/BREP representation. A Game engine needs geometric information in a tessellated (triangulated) model. A converter tools is used to convert geometries in NURBS/BREP format into tessellated models in FBX or OBJ format, needed for game engines. An imported FBX in Unity shows all such kinematic assemblies generated by CAD tools in Unity as Game objects. These game objects in Unity have same name as the corresponding kinematic assemblies in CATIA. The names of all such kinematic assemblies are stored in the JSON file generated from CATIA. While reading JSON in Unity, these names are retrieved from JSON file and map the information accordingly. At step 204, the transformation matrix is converted into a gaming engine understandable pattern based on the co-ordinate system supported by the gaming engine. This step will be explained with the help of an example. This example is provided only for understanding purpose and does not limit the scope of this invention. In an exemplary embodiment, the transformation matrix is generated by CATIATM (a CAD tool) and received by Unity™ (a gaming engine). The default axis system in CATIATM and Unity™ are differently set. CATIATM has Euler right-handed Z-up axis system, where the x-axis is to right, z-axis is upwards and y-axis is into the page, as shown in FIG. 5. While in UnityTM, the default axis system is a Quaternion left-handed with Y-up system as shown in FIG. 6. In order to convert the rotational and positional data in CATIA animations to Unity animations, matrix transformations of these coordinate systems need to be applied. The animation of the game objects in Unity™ is represented as animation curve which has two properties: a) Position curve and b) Rotation curve.

Position Curve represents the position of a game object in X,Y,Z co-ordinates at any given time t. This can be represented as:

$$X=-x/1000$$

$$Y=y/1000$$

$$Z=z/1000$$

where, x,y,z are values from CATIATM data set.

Rotation Curve represents rotation value of a game object in X,Y,Z,W Quaternion coordinates at any given time t. This can be represented as:

Quaternion rotationVal=Quaternion.AngleAxis(-x, Vector3.right)*Quaternion.AngleAxis(y, Vector3.up)*Quaternion.AngleAxis(z, Vector3.forward)

where, x,y,z are values from CATIATM data set.

Thus, the resultant quaternion coordinates in Unity™ will be:
X=rotationVal.x
Y=rotationVal.y
Z=rotationVal.z
W=rotationVal.w The above mentioned conversion of transformation matrix needs to be done for every key frame if animation in Unity™. Referring back to FIG. 2, at step 206, a three dimensional representation of the plurality of components in the kinematic assembly is stored in a co-ordinate system supported by the gaming engine. In the above exemplary embodiment, the animation components are stored in quaternion representation in Unity™. Finally, at step 208, a 3D animation is generated in the gaming engine by applying tangential continuity to the three dimensional representation of each of the plurality of components in the kinematic assembly. Tangential continuity is required for the smooth rendering of object-rotation between two time frames (t1 and t2). In the exemplary embodiment, tangential continuity is applied to quaternion representation of each of the plurality of components of the animation in Unity™ 3D. In Unity™ 3D, the three dimensional animation in created based on the animation curve as mentioned hereinabove with respect to step 204. The animation curve defines how the property of the game objects of the 3D animation in Unity™ changes with time. Each 3D game object in Unity™ has the following properties i) position (x,y,z) and ii) rotation (x, y, z, w). The animation curves generated for each of these properties represented as pos_curve_x, pos_curve_y, pos_curve_z, rot_curve_x, rot_curve_y, rot_curve_z, rot_curve_w. The value of these curves at time t can be obtained as described hereinabove in Paragraph 0019 and 0020. These values are added to the corresponding curve as curve.

AddKey(t, value), where curve can be {pos_curve_x, pos_curve_y, pos_curve_z, rot_curve_x, rot_curve_y, rot_curve_z, rot_curve_w} and the corresponding value is {Xp, Yp,Zp,Xr,Yr,Zr,Wr}. Once the values of x,y and z from the JSON file are read by UnityTM, it automatically calculates it's corresponding Quaternion values by using well known standard Quaternion techniques. Once the animation curves are set, these are added to an AnimationClip object and finally this AnimationClip object is added to the Animation component (e.g. anim) of the 3D animation of the game objects in Unity™. The animation can be played on the game objects by using anim.Play( ) method.

Figure 3:
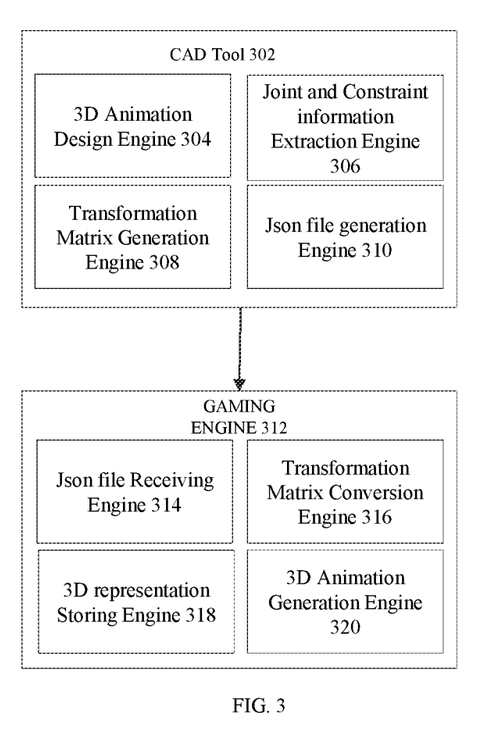
FIG. 3 is an architectural diagram of the system for generating three dimensional animation in gaming engine, in accordance with an embodiment of the present invention.

FIG. 3 is an architectural diagram of the system for generating three dimensional animation in gaming engine, in accordance with an embodiment of the present invention. The system comprises CAD tool 302 and Gaming Engine 312. The CAD tool 302 comprises 3D animation design engine 304, joint and constraint information extraction engine 306, Transformation matrix generation engine 308 and JSON file generation engine 310. The 3D animation design engine 304 is configured to design 3D animation of any kinematic assembly in CAD tool. Joint and Constraint extraction engine 306 is configured to extract complex joint and constraint information of all the components in the above mentioned kinematic assembly. The explanation of joint and constraint and how the information is extracted from the CAD tool are explained in detail hereinabove in relation to step 104 of FIG. 1. Transformation matrix generation engine 308 is configured to generate transformation matrix of all the components in the kinematic assembly. The generation of transformation matrix is explained in detail herein above in relation to step 106 of FIG. 1. The JSON file generation engine 310 is configured to generate JSON file which contains information related to the transformation matrix. This JSON file is imported in the Gaming engine 312. The Gaming engine 312 comprises JSON file receiving engine 314, Transformation matrix conversion engine 316, 3D representation storing engine 318 and 3D animation generation engine 320. The JSON file receiving engine 314 is configured to receive the JSON file containing the transformation matrix information from CAD tool. Transformation matrix conversion engine 316 is configured to covert the transformation matrix to a gaming engine understandable pattern based on the co-ordinate system supported by the gaming engine. The conversion process is explained in detail hereinabove in relation to step 204 of FIG. 2. The 3D representation storing engine 318 is configured to store the three dimensional representation of all the components of the kinematic assembly in a co-ordinate system based on the converted transformation matrix. The 3D animation generation engine 320 is configured to generate the three dimensional animation of the kinematic assembly by applying tangential continuity to the co-ordinate representation of the plurality of components of the kinematic assembly.

Figure 4:
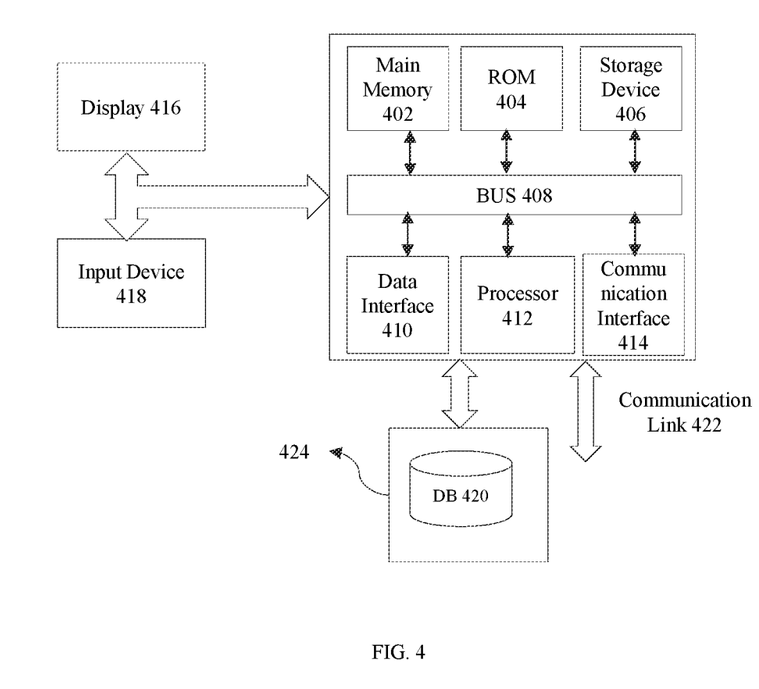
FIG. 4 is a diagram of a computer system with which the present invention can be implemented.

FIG. 4 is a diagram of a computer system with which the present invention can be implemented. In an embodiment of the invention, execution of the sequences of instructions required to practice the invention is performed by a single computer system. According to other embodiments of the invention, two or more computer systems coupled by a communication link 422 may perform the sequence of instructions required to practice the invention in coordination with one another. In order to avoid needlessly obscuring the invention, a description of only one computer system will be presented below; however, it should be understood that any number of computer systems may be employed to practice the invention. Each computer system may include a communication interface 414 coupled to the bus 408. The communication interface 414 provides two-way communication between computer systems. The communication interface 414 of a respective computer system transmits and receives electrical, electromagnetic or optical signals that include data streams representing various types of signal information, e.g., instructions, messages and data. A communication link 422 links one computer system with another computer system. For example, the communication link 422 may be a LAN, in which case the communication interface 414 may be a LAN card, or the communication link 422 may be a PSTN, in which case the communication interface 414 may be an integrated services digital network (ISDN) card or a modem.

A computer system may transmit and receive messages, data, and instructions, including program, i.e., application, code, through its respective communication link 422 and communication interface 414. Received program code may be executed by the respective processor(s) 412 as it is received, and/or stored in the storage device 406, or other associated non-volatile media, for later execution.

In an embodiment, the computer system operates in conjunction with a data storage system 406, e.g., a data storage system 424 that contains a database 420 that is readily accessible by the computer system. The computer system communicates with the data storage system 424 through a data interface 410. A data interface 410, which is coupled to the bus 408, transmits and receives electrical, electromagnetic or optical signals that include data streams representing various types of signal information, e.g., instructions, messages and data. In embodiments of the invention, the functions of the data interface 410 may be performed by the communication interface 414.

Computer system includes a bus 408 or other communication mechanism for communicating instructions, messages and data, collectively, information, and one or more processors 412 coupled with the bus 408 for processing information. Computer system also includes a main memory 402, such as a random access memory (RAM) or other dynamic storage device, coupled to the bus 408 for storing dynamic data and instructions to be executed by the processor(s) 412. The main memory 402 also may be used for storing temporary data, i.e., variables, or other intermediate information during execution of instructions by the processor(s) 412.

The computer system may further include a read only memory (ROM) 404 or other static storage device coupled to the bus 408 for storing static data and instructions for the processor(s) 412. A storage device 406, such as a magnetic disk or optical disk, may also be provided and coupled to the bus 408 for storing data and instructions for the processor(s) 412.

A computer system may be coupled via the bus 408 to a display device 406, such as, but not limited to, a cathode ray tube (CRT), for displaying information to a user. An input device 418, e.g., alphanumeric and other keys, is coupled to the bus 408 for communicating information and command selections to the processor(s) 412.

According to one embodiment of the invention, an individual computer system performs specific operations by their respective processor(s) 412 executing one or more sequences of one or more instructions contained in the main memory 402. Such instructions may be read into the main memory 402 from another computer-usable medium, such as the ROM 404 or the storage device 406. Execution of the sequences of instructions contained in the main memory 402 causes the processor(s) 412 to perform the processes described herein. In alternative embodiments, hard-wired circuitry may be used in place of or in combination with software instructions to implement the invention. Thus, embodiments of the invention are not limited to any specific combination of hardware circuitry and/or software.

The term "computer-usable medium," as used herein, refers to any medium that provides information or is usable by the processor(s) 412. Such a medium may take many forms, including, but not limited to, non-volatile, volatile and transmission media. Non-volatile media, i.e., media that can retain information in the absence of power, includes the ROM 404, CD ROM, magnetic tape, and magnetic discs. Volatile media, i.e., media that cannot retain information in the absence of power, includes the main memory 402. Transmission media includes coaxial cables, copper wire and fiber optics, including the wires that comprise the bus 408. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

The above mentioned description is presented to enable a person of ordinary skill in the art to make and use the invention and is provided in the context of the requirement for obtaining a patent. Various modifications to the preferred embodiment will be readily apparent to those skilled in the art and the generic principles of the present invention may be applied to other embodiments, and some features of the present invention may be used without the corresponding use of other features. Accordingly, the present invention is not intended to be limited to the embodiment shown but is to be accorded the widest scope consistent with the principles and features described herein.

What is claimed is:

1. A computer implemented method for generating three dimensional animation of a kinematic assembly designed by a Computer Aided Design (CAD) tool in a gaming engine, wherein the kinematic assembly comprises a plurality of components, the method comprising:

receiving, by a processor of the gaming engine, a transformation matrix from the CAD tool for each of the plurality of components of the kinematic assembly, wherein the transformation matrix comprises position information of each of the plurality of components of the kinematic assembly at a unit time, wherein the CAD tool extracts information related to joints and constraints of the plurality of components of the kinematic assembly and generates a three dimensional animation curve comprising position curves and rotation curves in each of the three dimensions in real time based on the information related to joints and constraints;

converting, by the processor of the gaming engine, the transformation matrix for each of the plurality of components of the kinematic assembly into a gaming engine understandable pattern based on a co-ordinate system supported by the gaming engine;

storing, by the processor of the gaming engine, a three dimensional representation of the plurality of components based on the converted transformation matrix; and generating, by the processor of the gaming engine, the three dimensional animation of the kinematic assembly in the gaming engine.

2. The computer implemented method of claim 1, wherein the CAD tool generates a JSON file to store the transformation matrix.

3. The computer implemented method of claim 2, wherein the JSON file is imported to the gaming engine.

4. The computer implemented method of claim 3, wherein the plurality of components present in the JSON file is mapped with a plurality of game objects in the gaming engine.

5. The computer implemented method of claim 4, wherein animation of the plurality of game objects is represented as three dimensional animation curve.

6. The computer implemented method of claim 5, wherein the three dimensional animation curve is created by the gaming engine based on information stored in JSON file received from CAD tool.

7. The computer implemented method of claim 1, wherein the three dimensional representation is stored as a Quaternion representation.

8. A system for generating three dimensional animation of a kinematic assembly designed by a Computer Aided Design (CAD) tool in a gaming engine, wherein the kinematic assembly comprises a plurality of components, the system comprising:
   one or more processors; and
   one or more memories operatively coupled to at least one of the one or more processors and having instructions stored thereon that, when executed by at least one of the one or more processors, cause the at least one of the one or more processors to:
   receive a transformation matrix from the CAD tool for each of the plurality of components of the kinematic assembly, wherein the transformation matrix comprises position information of each of the plurality of components of the kinematic assembly at a unit time, wherein the CAD tool extracts information related to joints and constraints of the plurality of components of the kinematic assembly and generates a three dimensional animation curve comprising position curves and rotation curves in each of the three dimensions in real time based on the information related to joints and constraints;
   convert the transformation matrix for each of the plurality of components of the kinematic assembly into a gaming engine understandable pattern based on a co-ordinate system supported by the gaming engine;
   store a three dimensional representation of the plurality of components in the gaming engine based on the converted transformation matrix; and
   generate the three dimensional animation of the kinematic assembly in the gaming engine by applying tangential continuity to the stored three dimensional representation.

9. The system of claim 8, wherein the CAD tool generates a JSON file to store the transformation matrix.

10. The system of claim 9, wherein the JSON file is imported to the gaming engine.

11. The system of claim 10, wherein the plurality of components present in the JSON file is mapped with a plurality of game objects in the gaming engine.

12. The system of claim 11, wherein animation of the plurality of game objects is represented as three dimensional animation curve.

13. The system of claim 12, wherein the three dimensional animation curve is created by the gaming engine based on information stored in JSON file received from CAD tool.

14. The system of claim 8, wherein the three dimensional representation is stored as a Quaternion representation.

15. A non-transitory computer readable medium having stored thereon instructions generating three dimensional animation of a kinematic assembly designed by a Computer Aided Design (CAD) tool in a gaming engine, wherein the kinematic assembly comprises a plurality of components, the non-transitory computer readable medium comprising machine executable code which when executed by at least one processor, causes the at least one processor to perform steps comprising:
   receiving a transformation matrix from the CAD tool for each of the plurality of components of the kinematic assembly, wherein the transformation matrix comprises position information of each of the plurality of components of the kinematic assembly at a unit time, wherein the CAD tool extracts information related to joints and constraints of the plurality of components of the kinematic assembly and generates a three dimensional animation curve comprising position curves and rotation curves in each of the three dimensions in real time based on the information related to joints and constraints;
   converting the transformation matrix for each of the plurality of components of the kinematic assembly into a gaming engine understandable pattern based on a co-ordinate system supported by the gaming engine;
   storing the converted transformation matrix in Quaternion representation in the gaming engine; and
   generating the three dimensional animation of the kinematic assembly in the gaming engine by applying tangential continuity to the Quaternion representation of each of the plurality of components of the kinematic assembly.

* * * * *